US012641757B2

(12) United States Patent
Chen et al.

(10) Patent No.: US 12,641,757 B2
(45) Date of Patent: May 26, 2026

(54) CONTROLLING ELECTRIC FANS IN CABINET ASSEMBLIES

(71) Applicant: Quanta Computer Inc., Taoyuan City (TW)

(72) Inventors: Yi-Chieh Chen, Taoyuan City (TW); Yueh-Chang Wu, Taoyuan City (TW); Yan-Kuei Chen, Taoyuan City (TW); Yi-Ta Hsu, Taoyuan City (TW)

(73) Assignee: Quanta Computer Inc., Taoyuan City (TW)

( * ) Notice: Subject to any disclaimer, the term of this patent is extended or adjusted under 35 U.S.C. 154(b) by 376 days.

(21) Appl. No.: 18/335,720

(22) Filed: Jun. 15, 2023

(65) Prior Publication Data

US 2024/0196573 A1 Jun. 13, 2024

Related U.S. Application Data

(60) Provisional application No. 63/386,860, filed on Dec. 9, 2022.

(51) Int. Cl.
*H05K 7/20* (2006.01)

(52) U.S. Cl.
CPC ..... *H05K 7/20836* (2013.01); *H05K 7/20163* (2013.01); *H05K 7/20718* (2013.01)

(58) Field of Classification Search
CPC .......... G06F 1/20; G06F 1/206; G06F 1/3206; G05B 13/024; G05B 2219/49216; G05B 11/42; H05K 7/20836; H05K 7/20209; H05K 7/207
See application file for complete search history.

(56) References Cited

U.S. PATENT DOCUMENTS

| | | | | |
|---|---|---|---|---|
| 6,368,064 B1* | 4/2002 | Bendikas | .............. | F04D 27/004 |
| | | | | 318/563 |
| 2006/0218423 A1* | 9/2006 | Diefenbaugh | .......... | G06F 1/206 |
| | | | | 713/310 |
| 2006/0222045 A1* | 10/2006 | Byquist | .................. | G01K 1/026 |
| | | | | 374/E7.042 |
| 2017/0082112 A1* | 3/2017 | Barron | .............. | H05K 7/20836 |
| 2018/0269821 A1* | 9/2018 | Locke | ........................ | H02P 5/68 |
| 2020/0218224 A1* | 7/2020 | Eiland | .................... | G06F 1/206 |
| 2020/0323102 A1* | 10/2020 | Artman | .............. | H05K 7/20172 |

(Continued)

*Primary Examiner* — Darrin D Dunn
(74) *Attorney, Agent, or Firm* — NIXON PEABODY LLP

(57) ABSTRACT

An example method for providing cooling capacity and reducing power consumption of a server assembly is disclosed. The method includes receiving temperature information corresponding to a CPU of an electrical component in the server assembly, which further includes an equipment room, and a cabinet fan module positioned adjacent to a side of the equipment room. The cabinet fan module includes electric fans therein, and the electrical component is implemented in the equipment room. The method includes determining a current power level of the CPU, and determining, using the temperature information and the current power level, a first operating speed for the electric fans. Furthermore, the method includes combining the first operating speed with a second operating speed received from a proportional-integral-derivative controller to determine a combined operating speed. The method still further includes instructing the electric fans to operate at the combined operating speed.

20 Claims, 5 Drawing Sheets

(56)        References Cited

U.S. PATENT DOCUMENTS

| | | | |
|---|---|---|---|
| 2021/0075863 A1* | 3/2021 | Achillopoulos | H04L 67/125 |
| 2021/0368649 A1* | 11/2021 | Kneller | H02P 7/2805 |
| 2022/0307712 A1* | 9/2022 | Nygaard | H02P 25/00 |
| 2023/0071918 A1* | 3/2023 | Park | G06F 1/206 |
| 2024/0155815 A1* | 5/2024 | An | H05K 7/20727 |
| 2025/0081408 A1* | 3/2025 | Lee | F04D 27/00 |
| 2025/0169026 A1* | 5/2025 | Wu | H05K 7/20136 |

* cited by examiner

CONTROLLING ELECTRIC FANS IN CABINET ASSEMBLIES

CROSS-REFERENCE TO RELATED APPLICATIONS

This application claims priority from and benefit of U.S. Provisional Patent Application Ser. No. 63/386,860, filed on Dec. 9, 2022, titled "Fan Speed Control By CPU Weighting," which is hereby incorporated by reference herein in its entirety.

TECHNICAL FIELD

The present disclosure relates generally to housing mechanisms for expansion components. More particularly, aspects of this disclosure relate to cabinet assemblies configured to provide cooling capacity while reducing power consumption of the devices therein.

BACKGROUND

Computer systems (e.g., desktop computers, blade servers, rack-mount servers, etc.) are employed in large numbers in various applications. High demand applications, such as network based systems, data centers, or high density finite element simulations that are able to push hardware of computing systems, use servers with specialized capabilities. Accordingly, modern servers are typically designed to allow flexibility in terms of capabilities and components.

Accordingly, compute architectures have changed over time. For instance, as computing throughputs increase, edge computing has been implemented in an attempt to reduce latency associated with accessing data over networks. Accordingly, servers that were originally located in data centers are being transitioned to user locations. While this design physically shortens the distance data travels, conventional implementations of such servers render them unfeasible at the user locations for other reasons.

Specifically, servers in data centers are designed to operate at a certain performance level. Sacrifices are often made in other areas in an effort to meet these performance capabilities, and as a result, a significant amount of noise is produced as a byproduct. This noise is caused by components like cooling fans operating at incredibly high revolutions per minute (RPMs), and baffling is minimized to increase airflow which further exacerbates the situation. Sacrifices are also often made in terms of power consumption efficiency to ensure the computing components of the servers can operate in a wide range of situations. While effective in terms of performance, it is not practical that these conventional servers be implemented in environments having any noise sensitivity and/or power constraints, e.g., such as the majority of edge server applications.

Thus, there is a need for a configuration that is able to achieve significant heat dissipation while also minimizing the amount of noise produced and power consumed as a result. Moreover, these reductions must be made despite processing heavy input/output (I/O) loads received from various users, applications, etc.

SUMMARY

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

An example method for providing cooling capacity and reducing power consumption of a server assembly is disclosed. The method includes receiving temperature information corresponding to a central processing unit (CPU) in the server assembly. The server assembly further includes a fan module having electric fans therein. The server assembly also includes a thermal heat sink, and an electrical component. The method includes determining a current power level of the CPU, and determining, using the temperature information and the current power level, a first operating speed for the electric fans. Furthermore, the method includes combining the first operating speed with a second operating speed received from a proportional-integral-derivative controller to determine a combined operating speed. The method still further includes instructing the electric fans to operate at the combined operating speed.

In some implementations, the method further includes receiving ambient temperature information from electronic temperature sensors, using the received ambient temperature information to determine an ambient temperature of the server assembly, and determining an updated operating speed by combining a third operating speed corresponding to the ambient temperature of the server assembly with the combined operating speed.

In other implementations, the current power level of the CPU includes a thermal design power value. Thus, in some implementations, determining the first operating speed for the electric fans includes comparing the thermal design power value to predetermined ranges, identifying one of the predetermined ranges that corresponds to the thermal design power value, and adjusting a base operating speed of the electric fans based on the identified predetermined range. In some implementations, adjusting the base operating speed of the electric fans based on the identified predetermined range includes: using the temperature information corresponding to the CPU to identify a duty cycle value, weighting the duty cycle value by an amount defined by the predetermined range, and instructing the electric fans to implement the weighted duty cycle.

In other implementations, the temperature information includes an average operating temperature of the CPU, and the temperature information is received from an electronic temperature sensor coupled to the CPU. For some implementations, instructing the electric fans to operate at the combined operating speed includes: sending the combined operating speed to a pulse width modulator (PWM), and instructing the PWM to cause the electric fans to operate at the combined operating speed.

In some implementations, the electric fans are configured to generate an airflow path that (i) originates at an air inlet of the server assembly, (ii) extends through the CPU and the thermal heat sink, and (iii) passes the electrical component before exiting the server assembly.

In other implementations, the server assembly includes multiple CPUs. Accordingly, determining the current power level of the CPU includes calculating an average power level of the multiple CPUs.

An example server assembly for providing cooling capacity and reducing power consumption is also disclosed. The server assembly includes an equipment room configured to implement electrical components therein, and a cabinet fan module positioned adjacent to a side of the equipment room. The cabinet fan module includes electric fans therein. Moreover, the server assembly includes an electrical component positioned in the equipment room, the electrical component having an air inlet area. The server assembly further includes, a processor for executing logic configured to perform the foregoing method according to any of the implementations.

An example computer program product for providing cooling capacity and reducing power consumption of a server assembly is also disclosed. The computer program product includes a computer readable storage medium having program instructions embodied therewith. Moreover, the program instructions are readable and/or executable by a processor to cause the processor to perform the foregoing method.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1:
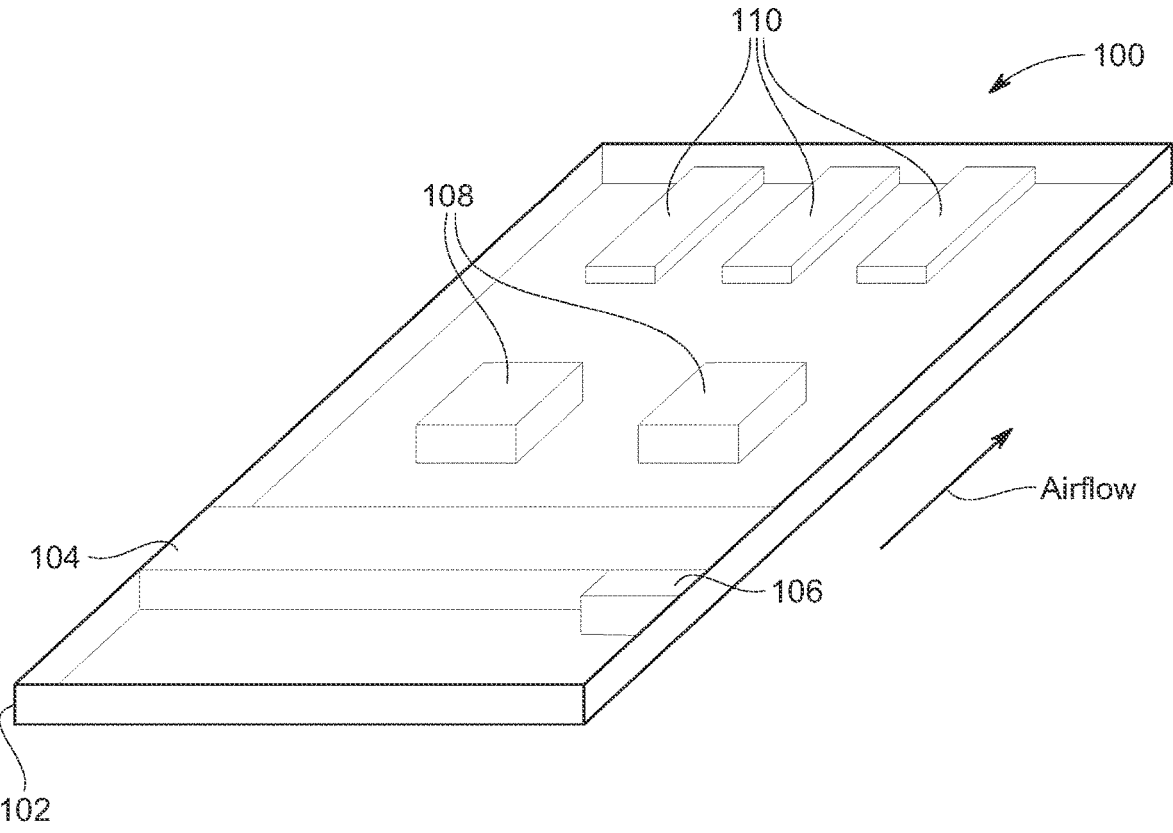
FIG. 1 is a perspective view of a compute cabinet assembly, according to certain aspects of the present disclosure.

The present disclosure is directed toward an example method for providing cooling capacity and reducing power consumption of a server assembly is disclosed. The method includes receiving temperature information corresponding to a central processing unit (CPU) in the server assembly. The server assembly further includes a fan module having electric fans therein. The server assembly also includes a thermal heat sink, and an electrical component. The method includes determining a current power level of the CPU, and determining, using the temperature information and the current power level, a first operating speed for the electric fans. Furthermore, the method includes combining the first operating speed with a second operating speed received from a proportional-integral-derivative controller to determine a combined operating speed. The method still further includes instructing the electric fans to operate at the combined operating speed.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical", "horizontal", "parallel", and "perpendicular" are intended to additionally include "within 3-5% of" a vertical, horizontal, parallel, or perpendicular orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

In sharp contrast to shortcomings experienced by conventional products, embodiments included herein are able to reduce power consumption, while also improving thermal efficiency and noise reduction, without inhibiting I/O performance. In other words, the approaches herein are able to reduce the power consumption, internal temperature, and the noise profile of server assemblies like edge servers or high performance computing (HPC) servers, e.g., such that they may be placed in a wider range of locations having greater noise sensitivities and/or power constraints than typical server warehouses.

However, this improved power consumption profile, thermal transfer, and noise reduction does not result in a corresponding reduction in performance, as typically experienced by conventional implementations. In fact, it has been verified with testing, that some of the approaches described herein are able to achieve power consumption reduction in addition to heat dissipation. Specifically, some of the implementations included herein were tested and found to reduce power consumption by between about 7.3% and about 20% during idle time of a corresponding system, and reduce power consumption by between about 7.9% and about 12.5% during operation of the system under various different settings. Again, this has been conventionally unachievable and is evidence as to the improvements that are achieved by the implementations included herein.

Figure 2:
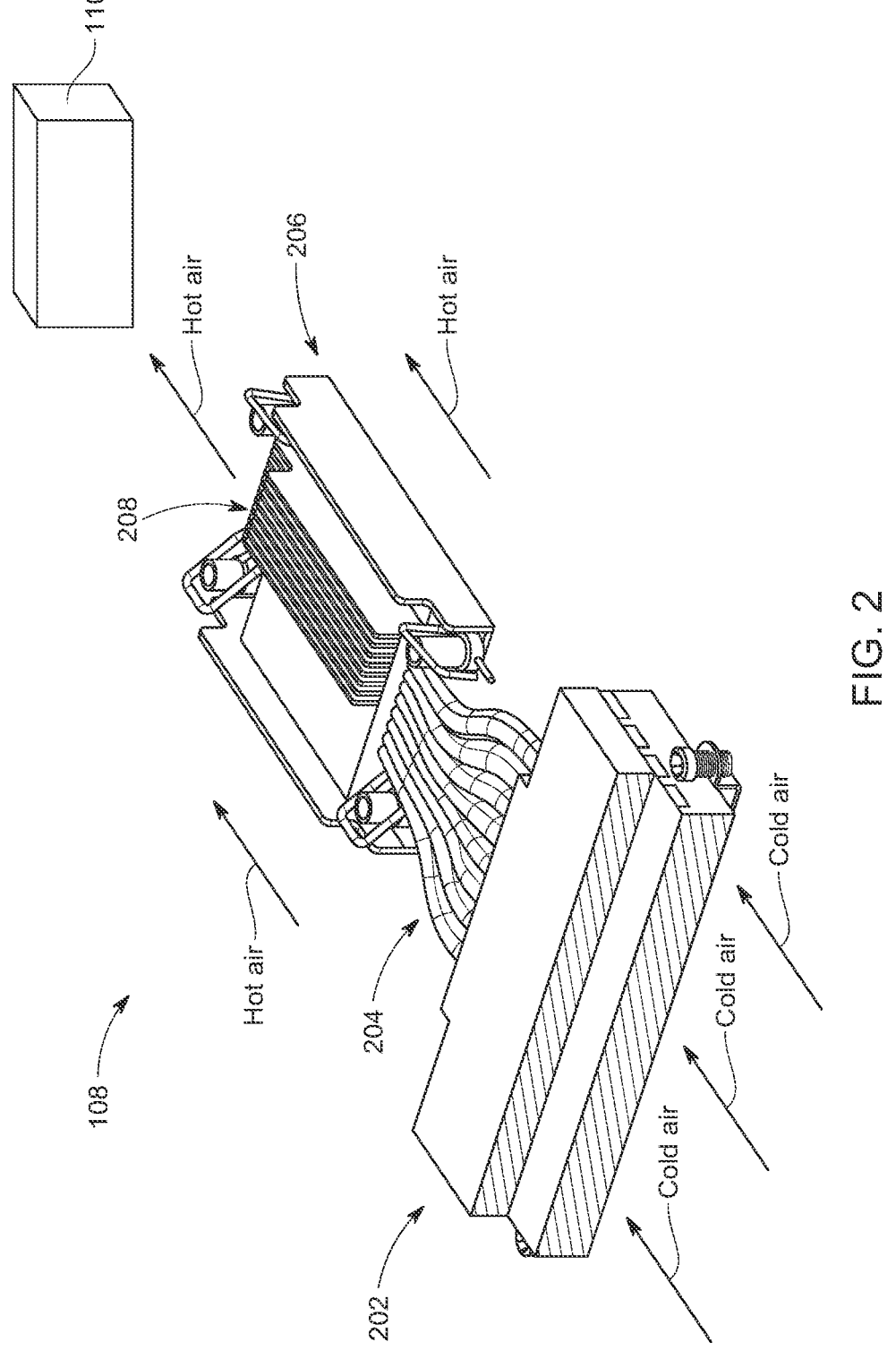
FIG. 2 is a detailed view of a CPU and heat sink pair of FIG. 1, according to certain aspects of the present disclosure.

For instance, FIGS. 1-2 show a server assembly 100 that is capable of efficiently providing cooling capacity while also reducing power consumption as well as noise production, in accordance with one embodiment. As an option, the present server assembly 100 may be implemented in conjunction with features from any other embodiment listed herein, such as those described with reference to the other FIGS. However, such server assembly 100 and others presented herein may be used in various applications and/or in permutations which may or may not be specifically described in the illustrative embodiments listed herein. Further, the server assembly 100 presented herein may be used in any desired environment. Thus FIGS. 1-2 (and the other FIGS.) may be deemed to include any possible permutation.

As shown, the server assembly 100 includes an outer surface 102 that serves as an outer periphery of the assembly 100, forming an interior area that includes various components therein. In some implementations the outer surface 102 fully encapsulates the interior area, e.g., to form a solid exterior for the interior area. In other implementations, one or more sides of the outer surface 102 may be at least partially removed, perforated, patterned with recesses, e.g., to allow air to pass through the assembly 100.

Looking to the interior formed by the outer surface 102, a fan module 104 is coupled to a fan controller 106. The fan module 104 includes one or more electric fans included therein and the fan controller 106 is preferably configured to control one or more operating settings of the electric fan(s) included in the fan module 104. For example, the fan controller 106 may be able to increase, decrease, or maintain the current operating speed of each respective electric fan in the fan module 104 to achieve a desired airflow and/or power consumption profile, e.g., as would be appreciated by one skilled in the art after reading the present description. For example, in some implementations, the fan controller 106 may include a pulse width modulator such that pulse width modulation may be performed on signals (e.g., instructions, commands, etc.) sent to the electric fans in the fan module 104.

The server assembly also includes CPU and heat sink pairs 108 positioned downstream from the fan module 104. Furthermore, electrical components 110 are positioned downstream from the CPU and heat sink pairs 108. With respect to the present description, "downstream" is intended to refer to the direction in which the electric fans in the fan module 104 direct airflow along the interior formed by the outer surface 102, e.g., towards an outlet along the outer surface 102 that allows for air to exit the server assembly 100. In such implementations, it follows that the outer surface 102 may also have one or more openings on an upstream side of the fan module 104 that allow for ambient air to enter the interior formed by the outer surface 102, thereby forming an airflow path.

As air travels along this airflow path and passes by (e.g., through) the CPU and heat sink pairs 108 along with the downstream electrical components 110. Accordingly, the air is able to absorb some of the thermal energy produced by the CPUs (e.g., see CPU 202 of FIG. 2) and electrical components 110, carrying it out of the server assembly 100. The speed of the airflow, temperature of the air in the airflow, etc., thereby has an impact on the achievable thermal capabilities of the server assembly 100.

For instance, the speed of the airflow (i.e., the speed by which air is moving along the airflow path) may be determined based on the operating speed(s) of the electric fans in the fan module 104. In other words, the electric fans may be controlled to operate at one or more desired speeds in order to maintain a particular operating temperature in the server assembly 100.

The heat sink in each pair 108 may also remove thermal energy from the server assembly 100. For instance, referring momentarily to FIG. 2, a more detailed view of a CPU and heat sink pair 108 is illustrated in accordance with one implementation. As an option, the present CPU and heat sink pair 108 may be implemented in conjunction with features from any other implementation listed herein, such as those described with reference to the other FIGS., such as FIG. 1. However, such pair 108 and others presented herein may be used in various applications and/or in permutations which may or may not be specifically described in the illustrative implementations listed herein. Further, the CPU and heat sink pair 108 presented herein may be used in any desired environment. Thus FIG. 2 (and the other FIGS.) may be deemed to include any possible permutation.

As shown, a CPU module 202 is coupled to a heat sink 206 by a network of tubing 204. A first end of the tubing 204 is coupled (or at least positioned adjacent) to an outlet of the CPU module 202 such that air which passes through the CPU module 202 enters the tubing 204. Preferably, a majority of the air that passes through the CPU module 202 enters the tubing 204 and is directed to the heat sink 206.

The heat sink 206 is preferably configured to extract thermal energy from the air being delivered from the CPU module 202. Thus, while the CPU module 202 increases the temperature of air in the system, the heat sink 206 is configured to counteract this increase. For instance, in some implementations, the heat sink 206 includes a number of fins 208 that are physically spaced from each other to facilitate the extraction of thermal energy from the air passing through the fins 208, e.g., as would be appreciated by one skilled in the art after reading the present description.

FIG. 2 also shows that the CPU and heat sink pair 108 is positioned upstream from an electrical component 110, e.g., as shown in FIG. 1. It follows that the heat sink 206 is able to remove thermal energy from the air passing therethrough before it reaches the electrical component 110. The electrical component 110 is thereby effectively thermally insulated from the CPU 202 by the heat sink 206. The thermal relationship between the CPU 202, the heat sink 206, and the electrical component 110 impacts performance of the overarching system as a whole. For instance, if thermal countermeasures achieved by the heat sink 206 are not taken into consideration while controlling the operating speed of the electric fans in the fan module 202, the system as a whole may consume an unnecessary amount of energy by keeping the system unnecessarily low.

Returning again to FIG. 1, it follows that the relationships between the various components in the server assembly 100 and how they impact thermal properties in the interior formed by the outer surface 102 is preferably taken into consideration when controlling the electric fans, e.g., as will be described in further detail below with respect to method 300 of FIG. 3A.

As a result, implementations included herein are able to significantly improve the efficiency by which server assemblies are able to operate. Again, by dynamically adjusting the operating speed of the electric fans in an assembly to adapt to changing conditions (e.g., such as a current workload of a processor in the assembly), power consumption as a whole is reduced, and characteristics of the airflow path formed in the assembly 100 is improved as well.

Moreover, by incorporating the thermal characteristics of the components in the server assembly 100 and how they impact air temperature therein. This improves thermal regulation, allowing for the electrical components included in the server assembly 100 to operate in a wider range of activation states without creating an undesirably high internal temperature of the server assembly 100 and/or consuming an undesirably high amount of power to satisfy incoming I/O requests. The electrical components 103 in the equipment room are thereby able to operate as needed rather than in a throttled manner as seen in conventional implementations that have been unable to achieved similar results to the various approaches included herein.

Other factors may also impact characteristics of the airflow path. For instance, air inlet channels may be designed to allow a desired amount (e.g., volume) of air to enter the interior formed by the outer surface 102. This desired amount of air may vary depending on the number of components included in the server assembly 100, the intended use of the server assembly 100, a size of the server assembly 100, the interior configuration(s) of the server assembly 100, etc. The dimensions of the various portions of the server assembly 100 may thereby vary depending on the implementation. For instance, the electric fans in the fan module 104 may be calibrated based on the amount (e.g., volume) of air an air inlet channel is configured to provide. Similarly, the electric fans in the fan module 104 may be calibrated based on the amount (e.g., volume) and direction of the air as it passes along the airflow path.

While the arrangement and/or dimensions of the different components in the server assembly 100 may impact the airflow flowrate (or speed at which air molecules are traveling along the airflow, availability of air also has an impact. For instance, as air speed along the airflow path increases, the airflow flowrate may increase as well. However, this linear relationship may not be true for all air speeds. Speeds outside a predetermined range (e.g., above a predetermined value) may actually decrease performance, e.g., by introducing air backflow in the server assembly 100. However, if the air speed is too low, there may not receive enough airflow and components may overheat as a result.

For instance, one or more guide plates, blocking plates, adjustable (e.g., selectively positionable) baffles, etc., may be positioned as desired in the server assembly 100. For example, the tubing 204 in FIG. 2 is configured to direct airflow from the CPU module 202 to the heat sink 208. In other implementations, guide plates and/or the blocking plates may be used to reduce airflow backflow.

While implementations herein can provide improved thermal regulation capabilities, these improvements are somewhat dependent on ambient air that is drawn into the server assembly 100. As noted above, air passing through the server assembly 100 absorbs some of the thermal energy produced by the various components therein. The speed of the airflow, temperature of the air in the airflow, etc., thereby has an impact on the achievable thermal capabilities of the server assembly 100.

It follows that by selectively adjusting the operating speed of the electric fans in the fan module 104, the fan controller 106 is able to control the thermal characteristics of the server assembly 100. For instance, according to an example, the server assembly 100 may serve as part of an edge computing node. The server assembly 100 may actually be positioned at a user's location in some implementations. This proximity to a data source allows for the server assembly 100 and components therein to provide content caching, service delivery, persistent data storage, etc. As a result, at least some of the implementations included herein are able to achieve faster insights, improved response times, better bandwidth availability, etc. Moreover, by improving the efficiency by which the electric fans are able to react to different situations and maintaining a desirable working environment (e.g., temperature), implementations herein are able to reduce power consumption. This is particularly desirable in situations having limited availability of power, e.g., as will be described in further detail below.

It may also be desirable that the server assembly 100 is implemented in environments having a lower ambient temperature than an average operating temperature in the interior formed by the outer surface 102. In other words, the server assembly 100 is preferably able to draw in ambient air that has a lower temperature than the air in the interior formed by the outer surface 102, e.g., during operation of the electrical components therein. In some implementations, the server assembly 100 may even be configured to condition (e.g., cool, dehumidify, etc.) air before it is used to cool the temperature in the equipment room, and thereby the electrical components therein.

As noted above, electric fans positioned in the fan module 104 of FIG. 1 are used to at least partially generate the airflow that passes through the server assembly 100. In other words, the electric fans are preferably configured to create airflow originating at an inlet of the outer surface 102.

In some implementations the fan module 104 and electric fans therein are controlled by any type of fan controller 106, e.g., such as a processor or other type of computing device to create this airflow. Accordingly, the electric fans in the fan module 104 may be turned on to create the airflow, or off to stop the airflow, by a processor that is able to determine whether to supply the electric fans with a supply voltage. In other implementations, the electric fans may receive instructions from a processor, and these instructions may be implemented in the electric fans by the fan controller 106 that controls motors in the fan module 104 that are able to actually rotate the electric fans to create the airflow, or stop them from rotating off to end the airflow.

For instance, the positive and negative pressures formed by the electric fans while operating (e.g., rotating) create a bias that draws ambient air into the server assembly 100, pushes the ambient air through the interior formed by the outer surface 102, and out through an air outlet. The orientation and/or amplitude of the air pressures formed by the electric fans may be selectively adjusted by changing the dimensions (e.g., pitch, length, thickness, etc.) of the physical blades in the electric fans, the operating speed of the electric fan(s), the orientation of the electric fans, the direction in which blades of the electric fans rotate, etc. It follows that the specific amount of airflow that is desired for a given situation may be achieved.

According to a specific example, which is in no way intended to limit the invention, the server assembly 100 functions as part of an edge server, a HPC server, or any other type of server that would be apparent to one skilled in the art. Over time, this server may be faced with different workloads and therefore will be throttled between different throughput levels, causing the electrical components therein to experience a range of operating settings. The operating speed of the electric fans in the fan module 104 may thereby be ramped up and down to achieve a sufficient airflow for the electrical components in the server assembly 100 to be cooled properly while also reducing power consumption and operating noise.

The electric fans in the fan module 104 may thereby communicate with one or more sensors positioned throughout the server assembly 100. For instance, temperature sensors (not shown) may be positioned throughout the server assembly 100 and relay temperature-based information to a processor that controls the operating settings of the various electric fans in the fan module 104. The temperature sensors may be positioned adjacent to one or more air outlets of the server assembly 100. In other implementations, the temperature sensors may be positioned adjacent to air inlets of the server assembly 100. Moreover, temperature sensors positioned at an air inlet may identify the temperature of incoming ambient air which indicates the cooling capacity of the ambient air. Temperature sensors may also be placed in the outlets in some implementations. The operating settings of the electric fans may thereby be adjusted based on how effective the ambient air is at absorbing heat from the server assembly 100, e.g., as would be appreciated by one skilled in the art after reading the present description.

While some implementations herein use temperature information to determine electric fan operating settings, any desired type of information may be used. For instance, information received from one or more humidity sensors, noise (audio) sensors, vibration sensors, workload sensors, etc. and/or combinations thereof, may be used to determine the desired operating speed of the electric fans in various implementations.

In some implementations, operating settings of the electric fans in the fan module 104 may be determined based on the various electrical components 110 in the system. For instance, the server assembly 100 may function as an edge server, a HPC server, or any other type of server. As noted above, electric fans included in servers may have an impact on an airflow throughout a server assembly. The operating conditions of electrical components in the server assembly are thereby taken into consideration in some implementations while controlling the operating settings of the electric fans. In other words, the process of controlling operating settings of the electric fans in the fan module 104 is based on how the various components in the server assembly 100 are operating. For example, an operating speed of the electric fans may be increased by a predetermined amount in response to determining that the CPUs in the pairs 108 are operating at 50% or more of a maximum achievable throughput. The operating speed of the electric fans may also be decreased based on how the electrical components 110 are operating. For example, an operating speed of the electric fans may decrease by a predetermined amount in response to determining that the electrical components 110 are operating at 50% or less of a maximum achievable throughput, e.g., as will soon become apparent.

It follows that depending on the configuration and/or operating settings of the electric fans in the fan module 104, they may consume an unnecessary amount of power, produce a significant amount of noise, and/or cause an undesirable amount of turbulence along the airflow path in some situations. As noted above, conventional implementations have been unable to improve thermal regulation without sacrificing performance capabilities. In sharp contrast, implementations included herein are able to maintain high amounts of thermal capacity without sacrificing power and/or negatively impacting performance levels.

It should again be noted that while various components in the server assembly 100 have been depicted and/or described as being positioned in certain configurations, this is in no way intended to be limiting. Rather, the different portions of the server assembly 100 may be implemented (e.g., positioned) differently. Similarly, the configuration of the server assembly 100 itself is in no way intended to be limiting.

It follows that approaches included herein are able to significantly improve thermal capacity while reducing power consumption. Moreover, these improvements over conventional implementations have been achieved without limiting performance. In other words, the approaches herein are able to significantly improve the efficiency by which thermal regulation of server assemblies like edge servers and HPC servers is performed, while also reducing their noise profiles such that they may be place in locations having greater noise sensitivity than typical server warehouses. The reduced power consumption resulting from more efficient performance also expands applicability of server assemblies like edge servers and HPC servers. Moreover, these improvements to thermal regulation and power consumption do not result in a corresponding reduction in performance, e.g., as typically experienced by conventional implementations.

According to some of these approaches, the heat and noise dissipation is achieved at least partially as a result of arranging the components in the server assembly 100 as depicted in FIG. 1. Moreover, by controlling operation of the electric fans as described in implementations herein, components in the assembly may operate as desired without negatively impacting conditions in the assembly (e.g., internal temperatures) and/or decreasing power efficiency, e.g., as will be described in further detail below.

It follows that the improvements that are achieved by the various approaches included herein may be realized (e.g., experienced) in response to simply activating the electric fans and/or electrical components in the server assembly 100. In other words, while the various physical portions of a server assembly and/or the electrical components may vary depending on the implementation, they may be configured to create an airflow path in response to receiving instructions to do so.

Figure 3A:
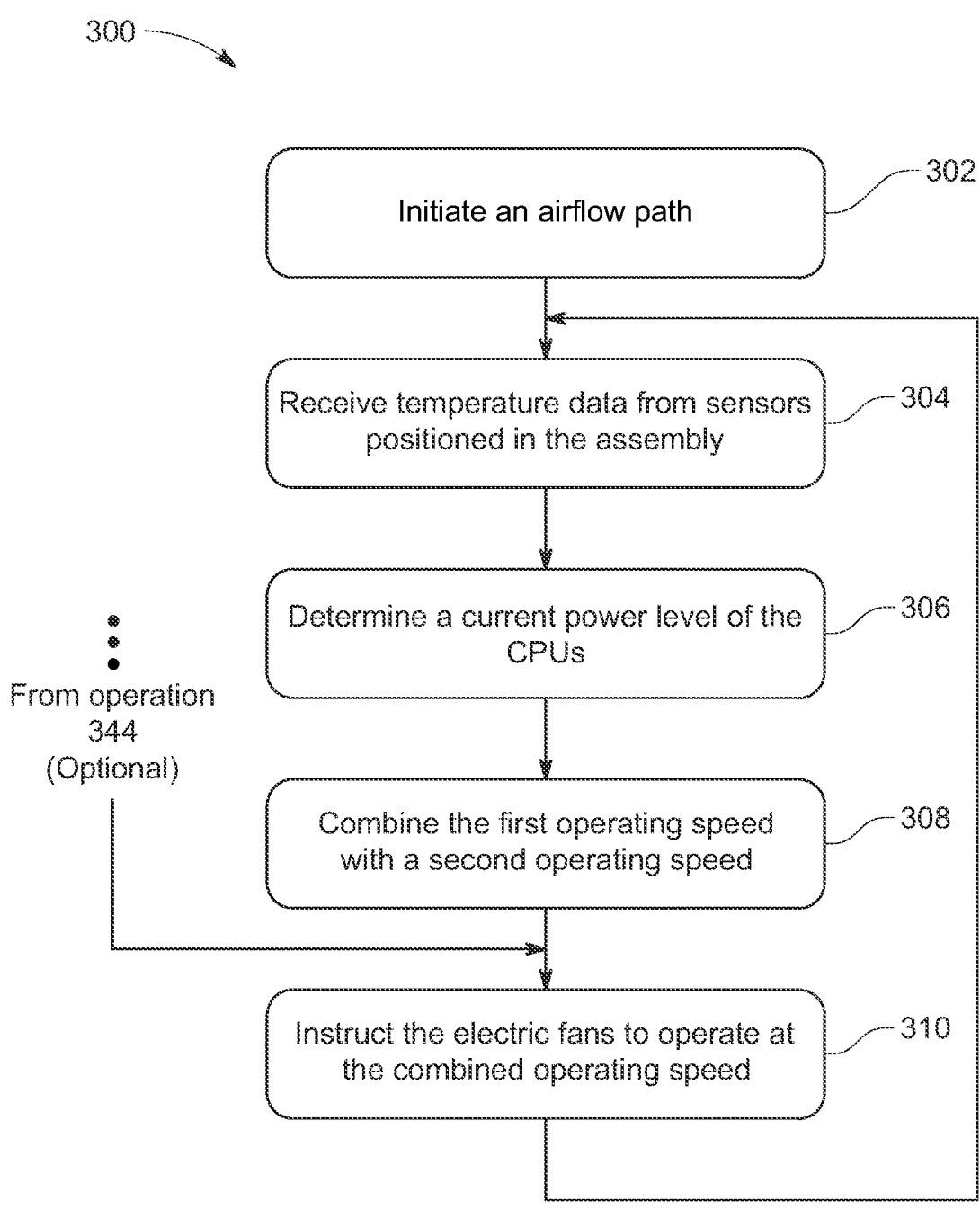
FIG. 3A is a flowchart of an example method for providing cooling capacity to a server assembly, according to certain aspects of the present disclosure.

For example, FIG. 3A illustrates a method 300 providing cooling capacity to, and reducing power consumption of, a server assembly, according to one implementation. Specifically, the various operations included in method 300 are described with respect to a server assembly having a similar configuration to the server assembly 100 depicted in FIGS. 1-2. Of course, more or less operations than those specifically described in FIG. 3A may be included in method 300, as would be understood by one of skill in the art upon reading the present descriptions.

Each of the steps of the method 300 may be performed by any suitable component of the operating environment. For example, one or more of the operations in method 300 may be performed by a fan controller and/or an RMC (e.g., see fan controller 106 of FIG. 1 above). In other implementations, the method 300 may be partially or entirely performed by a controller, a processor, a computer, etc., or some other device having one or more processors therein. Thus, in some embodiments, method 300 may be a computer-implemented method. Moreover, the terms computer, processor and controller may be used interchangeably with regards to any of the embodiments herein, such components being considered equivalents in the many various permutations of the present invention.

For those embodiments having a processor, the processor, e.g., processing circuit(s), chip(s), and/or module(s) implemented in hardware and/or software, and preferably having at least one hardware component may be utilized in any device to perform one or more steps of the method 300. Illustrative processors include, but are not limited to, a CPU, an application specific integrated circuit (ASIC), a field programmable gate array (FPGA), etc., combinations thereof, or any other suitable computing device known in the art.

Referring still to FIG. 3A, operation 302 includes causing an airflow path to initiate at an inlet of a server assembly. In other words, operation 302 may be achieved by activating one or more electric fans in a fan module. These electric fans may be activated in some approaches by sending one or more activation instructions to one or more controllers configured to operate the respective fans and/or components. In other implementations, operation 302 may be performed by a processor that is configured to operate the respective fans and/or components, and thereby the airflow path may be initiated by simply activating one or more motors therein. According to an example, which is in no way intended to limit the invention, method 300 may be initiated by a processor in response to a server assembly being turned on, e.g., during a boot sequence of a central processor in a cabinet assembly.

It follows that operation 302 may include causing electric fans in a fan module to operate at one or more predetermined rotational speeds. Depending on the approach, the rotational speed(s) may be predetermined by a user, be preset by a manufacturer (e.g., based on product testing), predetermined by industry standards, etc. While operation 302 includes causing the electric fans to operate at one or more predetermined rotational speed, in some approaches the rotational speed is actually determined based on current operating settings of an assembly. For instance, operation 302 may include causing the electric fans to rotate at a speed that is in a range having bounds defined by the current throughput of the servers in an equipment room of the assembly, temperature readings, in the assembly, a current backlog (e.g., latency) of the assembly, etc.

In some implementations, the electric fans receive instructions to operate at a predetermined rotational speed. For example, each of the electric fans may be instructed to rotate at a base operating speed. Moreover, the base operating speed may vary depending on the types of electric fans, the configuration of the assembly, the number of electrical components in the assembly, etc. In some approaches, the base operating speed may be between about 10% and about 80% of the maximum operating speed of the electric fans. In other approaches, the base operating speed may be between about 30% and about 80% of an average of the maximum operating speeds for the electric fans, more preferably between about 20% and about 90% of the average, but could be higher or lower depending on the implementation.

It should also be noted that the instructions may be received in different forms depending on the approach. For instance, some approaches involve implementing a PWM that controls the combinations of electrical signals received and implemented to cause the electric fans to rotate at a desired rotational speed, e.g., as would be appreciated by one skilled in the art after reading the present description. Other approaches involve sending a block control signal that ultimately causes the electric fans to operate at a constant, predetermined speed. In still other approaches, instructions may be received that cause different ones of the electric fans to operate at different (e.g., unique) predetermined speeds such that a combined airflow speed is achieved.

From operation 302, method proceeds to operation 304, which includes receiving temperature information. The temperature information corresponds to one or more CPUs in a server assembly (e.g., see server assembly 100 of FIGS. 1-2). The type and/or amount of temperature information received may vary depending on the implementation. For instance, temperature information may be received from temperature sensors positioned in the server assembly. In some implementations, the temperature sensors may include resistance thermometers electrically coupled to the CPUs and/or other components in the server assembly. In other implementations, the temperature sensors may be configured to read the air temperature surrounding a component, in the server assembly, at an air outlet of a component in the server assembly, an air outlet of the server assembly itself, etc., and relay that information back to a controller.

In some instances, this temperature information may further be compared against temperature data received from one or more temperature sensors positioned in the air inlet or inlet channel of the assembly, e.g., to determine if air backflow is present. Temperature information received from different temperature sensors may be averaged in some implementations to determine an average operating temperature of the CPUs. In other approaches, the different temperature information received from the different sensors may be combined differently.

With continued reference to FIG. 3A, operation 306 includes determining a current power level of the one or more CPUs. The received temperature information is typically used to determine the current power levels of the respective CPUs. It follows that in some implementations, the temperature information may include temperature readings, electrical current readings, electrical voltage drop readings, etc. Moreover, this temperature information may be used in combination with information corresponding to the CPUs (e.g., thermal design power values, power output ranges, etc.) to derive the current power levels of the CPUs.

The current power levels may be measured differently depending on the particular implementation, but in some implementations, the current power levels may be measured in watts. However, in other implementations the current power levels may be (e.g., represented as) a percentage of a maximum power level for the respective CPU. Other representations may also be implemented. According to an example, which is in no way intended to limit the invention, the temperature information includes an electrical current passing through each of the CPUs. The values of the electrical currents may be compared to a lookup table to determine the corresponding power levels of the CPUs.

Proceeding to operation 306, there method 300 includes determining an updated operating speed for the electric fans. While the electric fans may be set to an operating speed appropriate for an assembly at a given point in time, performance of the assembly changes over time as requests are received, applications are run, operations are completed, etc. By dynamically adjusting the operating speeds of the electric fans, implementations herein are able to adapt to constantly changing workload overheads while maintaining efficient performance (e.g., power consumption).

It follows that the updated operating speed is preferably based on the received temperature information and/or the determined current power levels of the CPUs. These values provide an accurate and updated perspective on how each of the CPUs are performing. Accordingly, the received temperature information and/or the determined current power levels of the CPUs can be used to determine operating settings for the electric fans that results in a desired amount of cooling capacity for the current situation. As noted above, this allows the apparatus to satisfy workloads as they are received while reducing the amount of power that is consumed to do so, particularly compared to conventional products. This is a particularly notable achievement, as implementations included herein are able to process a greater number of compute operations while consuming less power than conventionally achievable. In other words, implementations herein improve the efficiency by which server assemblies and components therein can operate, e.g., as would be appreciated by one skilled in the art after reading the present description.

Figure 3B:
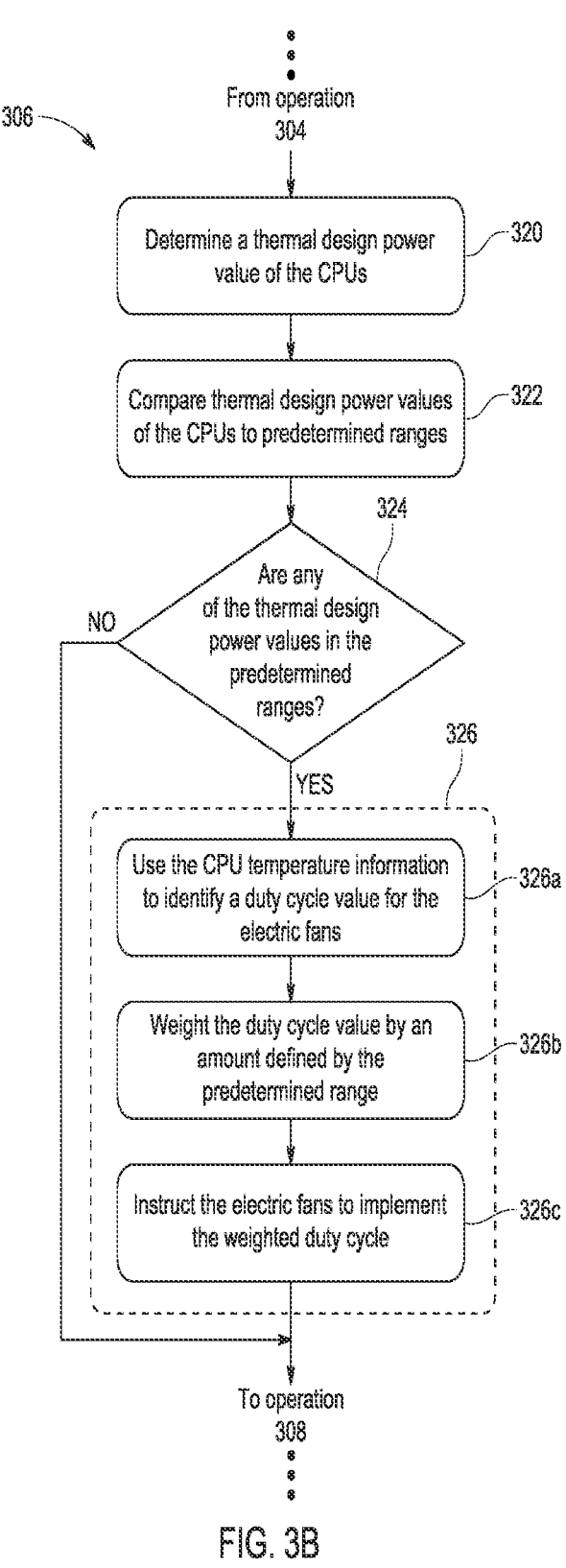
FIG. 3B is a flowchart of sub-operations for one of the operations in the method of FIG. 3A, in accordance with one embodiment.

For instance, referring momentarily to FIG. 3B, exemplary sub-operations of determining a combined, updated operating speed for electric fans are illustrated in accordance with one implementation. It follows that any one or more of the sub-operations in FIG. 3B may be used to perform operation 306 of FIG. 3A. However, it should be noted that the sub-processes of FIG. 3B are illustrated in accordance with one embodiment which is in no way intended to limit the invention.

As shown, sub-operation 320 of FIG. 3B includes determining a thermal design power value of each of the CPUs. In preferred approaches, the thermal design power values correspond to the current power levels of the respective CPUs. A thermal design power value is typically represented in watts, and refers to the power consumption under the maximum theoretical load for the given component. Thus, the thermal design power value of one or more CPUs may represent the maximum theoretical number of watts the one or more CPUs are producing, or at least capable of producing. In some implementations, the current power level of the CPUs may include information such as a thermal design power value of the CPUs.

This value may be based on the current operating conditions of the CPUs and/or the greater server assembly depending on the approach. Accordingly, this thermal design power value may be determined using different types of information that corresponds to the CPUs. For instance, the thermal design power value may be determined based on temperature information, current throughput levels, electrical current draw information, etc., received from the CPUs and/or other sensors corresponding thereto. In some approaches, the information received may be compared to a lookup table to determine corresponding values.

Sub-operation 322 further includes comparing one or more thermal design power values of the CPUs to predetermined ranges. The predetermined ranges may correspond to different operating conditions of the CPUs themselves and/or other components in the assembly, e.g., such as the electric fans. It should also be noted that comparing the thermal design power value of the CPUs to predetermined ranges is in no way intended to be limiting. Rather than determining how a thermal design power value compares to predetermined ranges, equivalent determinations may be made, e.g., as to whether a value is greater than a threshold, whether a value is outside a predetermined range, whether an absolute value is above a threshold, whether a value is below a threshold, etc., depending on the desired approach.

Sub-operation 324 includes determining whether one or more of the thermal design power values of the CPUs are in the predetermined ranges. In other words, sub-operation 324 includes determining whether any of the thermal design power values determined in sub-operation 320 are in different ranges of values. As mentioned above, it should again be noted that although information pertaining to the CPUs (e.g., such as the thermal design power values) are used to control the electric fans, other types of components may also be evaluated. For example, thermal design power values corresponding to graphics processing units, power supply units, hard disk drives, etc. in the assembly may be used, at least in part, to determine the desired operating conditions of the electric fans.

In response to identifying that at least one of the thermal design power values is in at least one of the predetermined ranges, FIG. 3B proceeds from sub-operation 324 to sub-operation 326. There, sub-operation 326 includes adjusting a base operating speed of the electric fans using the identified predetermined range. However, the flowchart is seen as proceeding directly to operation 308 in response to determining that none of the thermal design power values are in the predetermined ranges. In other words, no adjustments may be made to the operating settings of the electric fans in situations where the thermal design power values cannot be identified.

Returning now to sub-operation 326, the process of using the identified predetermined range to adjust the base operating speed of the electric fans may differ depending on the implementation. For instance, some implementations involve using information (e.g., temperature, workload, electric current draw, etc.) corresponding to the CPUs in servers of a server assembly. Looking to sub-operation 326, processes associated with adjusting the base operating speed of the electric fans are depicted in accordance with the present implementation, which again is in no way intended to limit the invention. Thus, although specific processes are shown as being included in sub-operation 326, the process of updating the base operating speed of the electric fans may be performed differently in other implementations.

As shown, process 326a includes using the temperature information corresponding to the CPUs to identify a duty cycle value to be applied to the electric fans. In some implementations, the duty cycle is calculated dynamically and compared to a lookup table for other predetermined settings for the electric fans. In other implementations, the duty cycle is determined by comparing the temperature information to a stepwise progression (e.g., step function) correlating different temperature values to duty cycle settings for the electric fans, e.g., as would be appreciated by one skilled in the art after reading the present description.

Process 326b further includes weighting the duty cycle value by an amount defined by the predetermined range. As noted above, the predetermined range identified above in sub-operations 324 and 326 may have different types of information that is associated therewith. For instance, in some approaches the predetermined range identifies (e.g., defines) one or more weighting values and how they apply to the duty cycle value identified above in process 326a. In other words, a weighting value may directly correspond to the one or more thermal design power values of the CPUs.

From process 326b, FIG. 3B proceeds to process 326c, which includes instructing the electric fans to implement the weighted duty cycle. In other words, process 326c includes sending one or more instructions to the electric fans directly and/or a controller coupled to the electric fans, the one or more instructions causing the electric fans to operate according to the weighted duty cycle identified in process 326*b* above. In some implementations, the weighted duty cycle may be sent to a PWM along with instructions that ultimately result in the electric fans operating as desired, e.g., at one or more desired speeds.

From sub-operation 326 of FIG. 3B, the flowchart is shown as returning to operation 308 of FIG. 3A. There, operation 308 further includes combining the first operating speed determined in operation 306, with a second operating speed. In other words, operation 308 includes merging two different operating speeds of the electric fans to determine a combined operating speed. The process of combining the two operating speeds may be achieved differently depending on the implementation. For instance, in some implementations the first and second operating speeds may simply be averaged to determine a combined mean operating speed. In other implementations, the first and second operating speeds may be compared to predetermined ranges, weighted based on additional factors (e.g., a type of operation), input in one or more equations, etc.

Moreover, the second operating speed may be received from different sources depending on the implementation. In some implementations, the second operating speed may be received from a proportional-integral-derivative (PID) controller implemented in the assembly. It follows that the second operating speed received from the PID controller may be feedback corresponding to current operating conditions of electric fans and/or other components in the assembly.

Method 300 further includes instructing the electric fans to operate at the combined operating speed. See operation 310. In other words, operation 310 includes sending one or more instructions that ultimately cause the electric fans to implement the combined operating speed determined in operation 308. The one or more instructions may be sent directly to the electric fans, to an electric fan controller (e.g., see fan controller 113 of FIG. 1D), an RMC (e.g., see RMC 152 of FIG. 1D), a PWM, etc., depending on the implementation.

For instance, the process of instructing the electric fans to operate at a specific operating speed (e.g., the combined operating speed) may involve a PWM. In some approaches, the combined operating speed may be sent to a PWM for implementation. One or more instructions may also be sent to the PWM which ultimately result in the PWM causing the electric fans to operate at the combined operating speed, e.g., as would be appreciated by one skilled in the art after reading the present description.

As noted above, causing the electric fans to operate at the combined speed results in the assembly to perform at a higher level of efficiency than has been previously achievable. Implementations herein incorporate information that directly corresponds to performance settings of the various components in the assembly. Thus, efficient performance is maintained over time, even as workloads, temperatures, backlogs, etc. change over time. This is particularly desirable as assemblies are not forced to choose between satisfying incoming workloads in a timely manner and maintaining efficient performance. Again, many conventional products simply operate at inefficient and undesirable settings to ensure latency does not suffer. While this ensures workloads are processed, it undesirably results in high power consumption, inefficient use of compute resources, high noise, etc.

Referring still to FIG. 3A, method 300 is shown as returning to operation 304 from operation 310. Accordingly, in some implementations the operations in method 300 may be repeated in an iterative fashion over time. This allows for additional temperature information, CPU power level information, and/or other types of information to be received over time such that performance of the electric fans is dynamically adjusted to account for changes in operating conditions. In some implementations, method 300 may be performed in the background of other running applications, e.g., such that performing the various operations of method 300 do not interfere with other processes being performed. In other implementations, one or more of the operations of method 300 may be integrated with electric fan control logic, central controller processing routines, etc.

As noted above, some implementations may incorporate additional information in determining the desired operating speed(s) of the electric fans. This may vary depending on the configuration of the server assembly, the electric components included there, the number and/or type of sensors implemented with the server assembly, etc. For instance, looking now to FIG. 3C, exemplary operations associated with incorporating additional information in determining the desired operating speed of the electric fans are presented in accordance with one implementation. As shown in FIG. 3A, the operations in FIG. 3C may optionally be incorporated in method 300, e.g., as will soon become apparent. It should also be noted that the operations of FIG. 3C are illustrated in accordance with one implementation which is in no way intended to limit the invention.

Figure 3C:
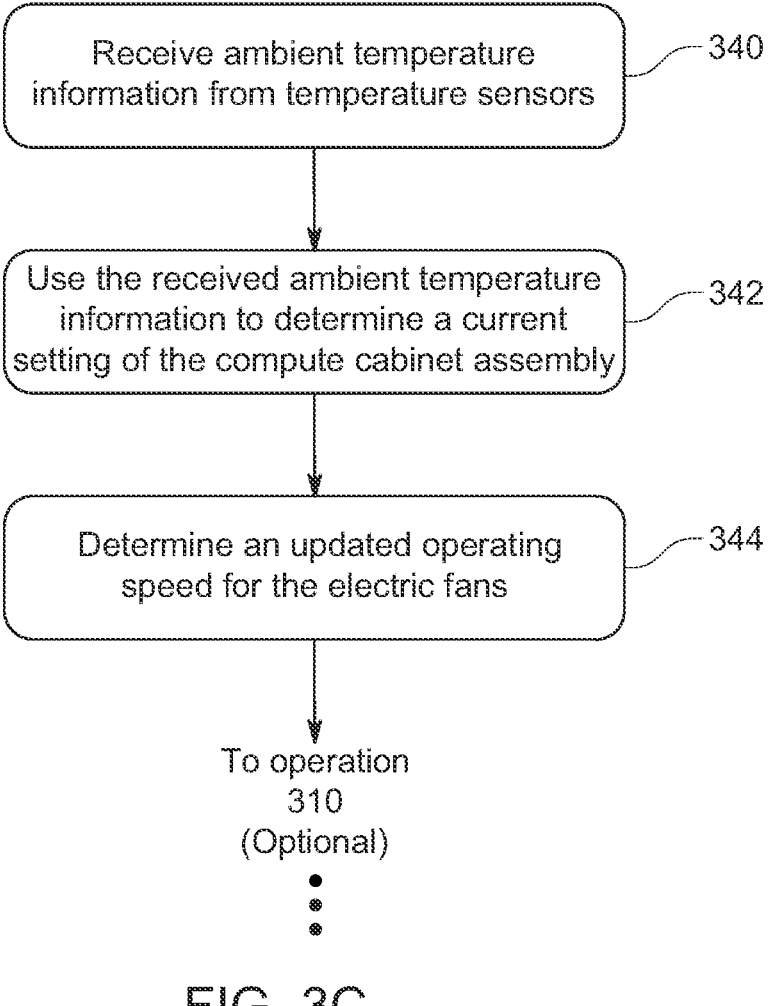
FIG. 3C is a flowchart of sub-operations for one of the operations in the method of FIG. 3A, in accordance with one embodiment.

As shown, FIG. 3C includes receiving ambient temperature information from temperature sensors. See operation 340. The number and/or type of temperature sensors that temperature information is received from varies depending on the approach. For instance, some approaches may implement electronic temperature sensors (e.g., resistance thermometers) that are electrically coupled to certain points of an electrical circuit. In other approaches, one or more temperature sensors may be placed adjacent to an air outlet of a server implemented in an assembly, inside the assembly itself, at an air inlet channel of the assembly, at air outlets of the assembly, etc. In still other approaches, information other than temperature values may be received from the sensors, e.g., such as humidity readings, may be received and incorporated in determining the desired operating speed of the electric fans to produce desired settings for electric devices included in the assembly.

Operation 342 further includes using the received ambient temperature information to determine a current setting of the server assembly. As noted above, the temperature information received may vary depending on the approach. It follows that for approaches where the temperature information includes ambient temperature information corresponding to the assembly, operation 342 includes determining an ambient temperature of the server assembly. The process of determining the ambient temperature may also vary. For instance, the ambient temperature may be determined by averaging temperature readings received from different sensors, weighting certain temperature readings based on a position of the corresponding temperature sensor, etc. However, other approaches may involve determining different information about the assembly. For example, approaches that involve receiving humidity information may include determining a humidity level in the assembly.

From operation 342, the flowchart proceeds to operation 344 which includes determining an updated operating speed for the electric fans based on the determined current condition of the assembly and the components included therein. In some approaches, this updated operating speed is determined by first identifying a "third" operating speed that corresponds to the determined current condition of the assembly and the components included therein. This third operating speed may thereafter be merged with the combined operating speed determined in operation 308 of FIG. 3A. As noted above, this merging of different operating speeds may be accomplished by averaging the different operating speeds, weighting certain operating speeds differently, calculating a weighted average of the operating speeds, comparing values to predetermined ranges, etc. It follows that any one or more of the implementations described above with respect to operation 308 of FIG. 3A may be implemented to perform operation 344, e.g., as would be appreciated by one skilled in the art after reading the present description.

It should be noted that the amount by which the operating speed of the electric fans is increased when adjusting performance may be greater than the amount by which the operating speed of the electric fans is decreased. This is because it is desirable in some approaches to increase the operating speed sufficiently to accommodate a current operating condition, while undesirable to reduce the operating speed by an excessive amount. For instance, the operating speed of the electric fans may be increased between about 3% and about 10% of a maximum operating speed in response to meeting a predetermined condition (e.g., see operation 308), could be higher or lower depending on the implementation. However, the operating speed may be decreased between about 1% and about 3% of the maximum operating speed in response to meeting another predetermined condition (e.g., see operation 316), but again, this could be a higher or lower percentage depending on the implementation. For example, the rate by which electric fan speeds are increased and/or decreased may be adjusted to improve power efficiency, reduce latency (e.g., in periods of high throughput), adjust internal temperature readings, etc.

The process by which different characteristics of a server assembly are weighed to determine specific operating conditions for the electric fans that produce desired results for the particular situation may further be developed by training a machine learning model. The machine learning model may be of any desired type and may be trained in a supervised, supervised, semi-supervised, reinforcement, etc. type manner. The training data may be gathered over time and/or from previous operations.

It follows that implementations included herein are desirably able to improve thermal capacity while simultaneously improving power consumption efficiency and reducing noise. Moreover, these improvements are achieved without limiting performance. In other words, the implementations herein are able to significantly improve the thermal regulation of server assemblies like edge servers and HPC servers, while also improving the efficiency by which the assemblies operate. This causes power consumption to drop while maintaining and even improving performance of the assembly and components therein. However, these improvements to thermal regulation, power consumption, noise reduction, etc., do not result in a corresponding reduction in performance, e.g., as typically experienced by conventional implementations.

According to some of these approaches, improvements to power consumption and noise dissipation is achieved at least partially as a result of dividing the server assembly into four portions (air inlet channel, air outlet channels, equipment room, and cabinet fan zone). Moreover, by positioning the air inlet channel at the bottom of the assembly, cold air is allowed to enter and absorbs the noise emitting from the components in the assembly. The air outlet channels are located on two sides of the equipment room, thereby allowing hot air to exit and absorb the noise emitting from the components in the assembly. Preferably, approaches herein utilize a fan control weight that is based on the current power levels of different CPUs (e.g., servers). Thus, low-wattage CPUs may be utilized with a lower weighting value than high-wattage CPUs to meet the cooling conditions of the CPUs and their respective downstream components. This again achieves energy usage optimization, e.g., as would be appreciated by one skilled in the art after reading the present description.

Furthermore, the cabinet fan module includes various electric fans, and is positioned on the top of the equipment room to create sufficient airflow to cool the components in the assembly. The electric fans may be controlled (e.g., as described in method 300 of FIG. 3A) automatically regulate the ambient temperature with respect to the local temperature readings at server inlets. By regulating electric fan operating speeds in correlation to server activity, the implementations herein are desirably able to improve power consumption efficiency, while also maintaining desirable thermal characteristics for the physical components in an assembly.

Moreover, a processor or a processing element may be trained to regulate the operating settings of the electric fans using machine learning programs, including supervised and/or unsupervised machine learning. The machine learning program may employ a neural network, which may be a convolutional neural network, a deep learning neural network, or a combined learning module or program that learns in two or more fields or areas of interest. Machine learning may involve identifying and recognizing patterns in existing data in order to facilitate making predictions for subsequent data. Models may be created based upon example inputs in order to make valid and reliable predictions for novel inputs to the electric fan controllers.

Additionally or alternatively, the machine learning programs may be trained by inputting sample data sets or certain data into the programs, such as temperature data, processing power, operational throughput, and/or other types of information received from the servers. The machine learning programs may utilize deep learning algorithms that may be primarily focused on pattern recognition, and may be trained after processing multiple examples.

In supervised machine learning, a processing element may be provided with example inputs and their associated outputs, and may seek to discover a general rule that maps inputs to outputs, so that when subsequent novel inputs are provided the processing element may, based upon the discovered rule, accurately predict the correct output. In unsupervised machine learning, the processing element may be required to find its own structure in unlabeled example inputs. In one embodiment, machine learning techniques may be used to extract the relevant temperature information, corresponding server activity data, and/or other data.

It should be noted that the use of temperature data in the various approaches herein is in no way intended to be limiting. For instance, temperature data may be used to estimate computational throughput of corresponding electrical components. Thus, in other implementations, different types of information, e.g., such as an electrical current supply, processing throughput, data access times, etc., may be used to determine server activity. The amount of activity each server is experiencing may thereby be used to determine whether the current operating speed of the electric fans should be increased, decreased, or maintained, e.g., as described above.

Moreover, any of the approaches included herein may be implemented as a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It should also be noted that, while various aspects of the implementations herein have been illustrated as including specific designs, orientations, numbers of components, etc., this is in no way intended to limit the invention. Rather, the implementations herein are presented for exemplary purposes only and may vary in design, orientation, number of components, etc., depending on the desired approach. It should also be noted that use of the terms "bottom", "lower", "top", "upper", etc., are in no way intended to be limiting. Any frames of reference used to describe the various implementations herein have been selected for illustrative purposes only and may be adjusted as desired.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A server assembly for providing cooling capacity and reducing power consumption, the server assembly comprising:
   a fan module having electric fans therein;
   a central processing unit (CPU);
   a thermal heat sink;
   an electrical component; and
   a processor for executing logic configured to:
      receive, by the processor, temperature information corresponding to the CPU;
      determine, by the processor, a current power level of the CPU;
      determine, by the processor using the temperature information and the current power level, a first operating speed for the electric fans, wherein the current power level of the CPU includes a thermal design power value, and wherein the determination is made by comparing the thermal design power value to predetermined ranges; identifying one of the predetermined ranges that corresponds to the thermal design power value; and adjusting a base operating speed of the electric fans based on the identified predetermined range;
      combine, by the processor, the first operating speed with a second operating speed received from a proportional-integral-derivative controller to determine a combined operating speed; and
      control, by the processor, the electric fans to operate at the combined operating speed.

2. The server assembly of claim 1, wherein the processor is further configured to:
   receive, by the processor, ambient temperature information from electronic temperature sensors;
   use, by the processor, the received ambient temperature information to determine an ambient temperature of the server assembly; and
   determine, by the processor, an updated operating speed by combining a third operating speed with the combined operating speed, the third operating speed corresponding to the ambient temperature of the server assembly.

3. The server assembly of claim 1, wherein, to adjust the base operating speed of the electric fans, the processor is further configured to:
   identify, by the processor, a duty cycle value based on the temperature information corresponding to the CPU;
   weigh, by the processor, the duty cycle value by an amount defined by the predetermined range; and
   instruct, by the processor, the electric fans to implement the weighted duty cycle.

4. The server assembly of claim 1, wherein the temperature information includes an average operating temperature of the CPU, and wherein the temperature information is received from an electronic temperature sensor coupled to the CPU.

5. The server assembly of claim 1, wherein, to instruct the electric fans to operate at the combined operating speed, the processor is further configured to:
   send, by the processor, the combined operating speed to a pulse width modulator (PWM); and
   instruct, by the processor, the PWM to cause the electric fans to operate at the combined operating speed.

6. The server assembly of claim 1, wherein the electric fans are configured to generate an airflow path that (i) originates at an air inlet of the server assembly, (ii) extends through the CPU and the thermal heat sink, and (iii) passes the electrical component before exiting the server assembly.

7. The server assembly of claim 4, wherein the thermal heat sink is coupled to the CPU, and wherein the thermal heat sink is configured to remove thermal heat from air received from the CPU along the airflow path.

8. The server assembly of claim 1, wherein the combined operating speed is a merger between the first operating speed and the second operating speed.

9. A method for providing cooling capacity and reducing power consumption of a server assembly, the method comprising:
   receiving temperature information corresponding to a central processing unit (CPU) in the server assembly, the server assembly further including:
      a fan module having electric fans therein;
      a thermal heat sink; and
      an electrical component;
   determining a current power level of the CPU including a thermal design power value;
   determining, using the temperature information and the current power level, a first operating speed for the electric fans, wherein the determining includes comparing the thermal design power value to predetermined ranges; identifying one of the predetermined ranges that corresponds to the thermal design power value; and adjusting a base operating speed of the electric fans based on the identified predetermined range;
   combining the first operating speed with a second operating speed received from a proportional-integral-derivative controller to determine a combined operating speed; and
   controlling the electric fans to operate at the combined operating speed.

10. The method of claim 9, further comprising:
   receiving ambient temperature information from electronic temperature sensors;

using the received ambient temperature information to determine an ambient temperature of the server assembly; and determining an updated operating speed by combining a third operating speed with the combined operating speed, the third operating speed corresponding to the ambient temperature of the server assembly.

11. The method of claim 9, wherein adjusting the base operating speed of the electric fans based on the identified predetermined range includes:

identifying a duty cycle value based on the temperature information corresponding to the CPU;

weighting the duty cycle value by an amount defined by the predetermined range; and instructing the electric fans to implement the weighted duty cycle.

12. The method of claim 9, wherein the temperature information includes an average operating temperature of the CPU, and wherein the temperature information is received from an electronic temperature sensor coupled to the CPU.

13. The method of claim 9, wherein instructing the electric fans to operate at the combined operating speed includes:

sending the combined operating speed to a pulse width modulator (PWM); and instructing the PWM to cause the electric fans to operate at the combined operating speed.

14. The method of claim 9, wherein the electric fans are configured to generate an airflow path that (i) originates at an air inlet of the server assembly, (ii) extends through the CPU and the thermal heat sink, and (iii) passes the electrical component before exiting the server assembly.

15. The method of claim 14, wherein the server assembly includes multiple CPUs, wherein determining the current power level of the CPU includes calculating an average power level of the multiple CPUs.

16. The method of claim 9, wherein the combined operating speed is a merger between the first operating speed and the second operating speed.

17. A computer program product for providing cooling capacity and reducing power consumption of a server assembly, the computer program product comprising a computer readable storage medium having program instructions embodied therewith, the program instructions readable and/or executable by a processor to cause the processor to:

receive, by the processor, temperature information corresponding to a central processing unit (CPU) in the server assembly, the server assembly further including:

a fan module having electric fans therein;

a thermal heat sink; and an electrical component;

determine, by the processor, a current power level of the CPU including a thermal design power value;

determine, by the processor using the temperature information and the current power level, a first operating speed for the electric fans, wherein the determining includes comparing the thermal design power value to predetermined ranges; identifying one of the predetermined ranges that corresponds to the thermal design power value; and adjusting a base operating speed of the electric fans based on the identified predetermined range;

combine, by the processor, the first operating speed with a second operating speed received from a proportional-integral-derivative controller to determine a combined operating speed; and control, by the processor, the electric fans to operate at the combined operating speed.

18. The computer program product of claim 17, wherein, to instruct the electric fans to operate at the combined operating speed, the program instructions are further readable and/or executable by the processor to cause the processor to:

send, by the processor, the combined operating speed to a pulse width modulator (PWM); and instruct, by the processor, the PWM to cause the electric fans to operate at the combined operating speed.

19. The computer program product of claim 17, wherein the electric fans are configured to generate an airflow path that (i) originates at an air inlet of the server assembly, (ii) extends through the CPU and the thermal heat sink, and (iii) passes the electrical component before exiting the server assembly.

20. The computer program product of claim 19, wherein the server assembly includes an edge server, wherein the thermal heat sink is coupled to the CPU, and wherein the thermal heat sink is configured to remove thermal heat from air received from the CPU along the airflow path.

* * * * *